US 8,952,453 B2

(12) United States Patent
Zhu et al.

(10) Patent No.: US 8,952,453 B2
(45) Date of Patent: Feb. 10, 2015

(54) MOSFET FORMED ON AN SOI WAFER WITH A BACK GATE

(75) Inventors: Huilong Zhu, Poughkeepsie, NY (US); Qingqing Liang, Lagrangeville, NY (US); Haizhou Yin, Poughkeepsie, NY (US); Zhijiong Luo, Poughkeepsie, NY (US)

(73) Assignee: Institute of Microelectronics, Chinese Academy of Sciences (CN)

( * ) Notice: Subject to any disclaimer, the term of this patent is extended or adjusted under 35 U.S.C. 154(b) by 26 days.

(21) Appl. No.: 13/580,053

(22) PCT Filed: Nov. 18, 2011

(86) PCT No.: PCT/CN2011/082415
§ 371 (c)(1),
(2), (4) Date: Aug. 20, 2012

(87) PCT Pub. No.: WO2013/053166
PCT Pub. Date: Apr. 18, 2013

(65) Prior Publication Data
US 2013/0093020 A1    Apr. 18, 2013

(30) Foreign Application Priority Data
Oct. 12, 2011    (CN) .......................... 2011 1 0308554

(51) Int. Cl.
*H01L 27/12*    (2006.01)
*H01L 21/84*    (2006.01)
(Continued)

(52) U.S. Cl.
CPC .......... *H01L 21/84* (2013.01); *H01L 29/66545* (2013.01); *H01L 29/78648* (2013.01); *H01L 27/1203* (2013.01)
USPC ............ 257/347; 257/365; 438/183; 438/318

(58) Field of Classification Search
CPC .................. H01L 29/66545; H01L 29/66537; H01L 21/84; H01L 27/1203; H01L 29/78648
USPC ............... 257/347, E21.4, E21.409, E21.443, 257/365; 438/183, 197, 217, 218, 311, 318
See application file for complete search history.

(56) References Cited

U.S. PATENT DOCUMENTS

| 6,979,846 B2 | 12/2005 | Yagishita et al. |
| 7,208,353 B2 | 4/2007 | Yagishita et al. |

(Continued)

FOREIGN PATENT DOCUMENTS

| CN | 1461058 A | 12/2003 |
| CN | 101079434 A | 11/2007 |
| CN | 101159289 A | 4/2008 |

OTHER PUBLICATIONS

"International Application Serial No. PCT/CN2011/082415, International Search Report and Written Opinion mailed Jul. 19, 2012", 9 pgs, (Dec. 10, 2011).

(Continued)

*Primary Examiner* — Khiem D Nguyen
(74) *Attorney, Agent, or Firm* — Schwegman Lundberg & Woessner, P.A.

(57) ABSTRACT

The present application discloses a MOSFET and a method for manufacturing the same. The MOSFET is formed on an SOI wafer, comprising: a shallow trench isolation for defining an active region in the semiconductor layer; a gate stack on the semiconductor layer; a source region and a drain region in the semiconductor layer on both sides of the gate stack; a channel region in the semiconductor layer and sandwiched by the source region and the drain region; a back gate in the semiconductor substrate; a first dummy gate stack overlapping with a boundary between the semiconductor layer and the shallow trench isolation; and a second dummy gate stack on the shallow trench isolation, wherein the MOSFET further comprises a plurality of conductive vias which are disposed between the gate stack and the first dummy gate stack and electrically connected to the source region and the drain region respectively, and between the first dummy gate stack and the second dummy gate stack and electrically connected to the back gate. The MOSFET avoids short circuit between the back gate and the source/drain regions by the dummy gate stacks.

17 Claims, 5 Drawing Sheets

(51) Int. Cl.
*H01L 29/66* (2006.01)
*H01L 29/786* (2006.01)

(56) References Cited

U.S. PATENT DOCUMENTS 7,537,978 B2   5/2009   Yagishita et al.
2011/0049577 A1   3/2011   Or-Bach et al.
2012/0168878 A1 *   7/2012   Abou-Khalil et al. ........ 257/401

OTHER PUBLICATIONS

"Chinese Application Serial No. 2011103085544, Office Action mailed Nov. 2, 2014", (w/ English Translation), 5 pgs.

* cited by examiner

MOSFET FORMED ON AN SOI WAFER WITH A BACK GATE

RELATED APPLICATIONS

This application is a National Phase application of, and claims priority to, PCT Application No. PCT/CN2011/082415, filed on Nov. 18, 2011, entitled "MOSFET AND METHOD FOR MANUFACTURING THE SAME", which claimed priority to Chinese Application No. 201110308554.4, filed on Oct. 12, 2011. Both the PCT Application and Chinese Application are incorporated herein by reference in their entireties.

TECHNICAL FIELD

The present disclosure relates to a MOSFET and a method for manufacturing the same, and in particular, to a MOSFET with a back gate and a method for manufacturing the same.

BACKGROUND

An important trend of development in semiconductor technology is scaling down of metal-oxide-semiconductor field effect transistors (MOSFETs) for improving integration level and reducing manufacturing cost. However, it is well known that short channel effects arise as the size of MOSFETs decreases. As the MOSFETs are scaled down, a gate also has a reduced effective length and actually controls fewer charges in a depletion region when a gate voltage is applied. Consequently, a threshold voltage of the MOSFETs drops with a reduced channel length.

In the MOSFETs, it may be desirable on one hand that the threshold voltage of the device is increased to suppress the short channel effects, and on the other hand that the threshold voltage of the device is decreased to reduce power consumption in a low supply voltage application, or in an application using both P-type and N-type MOSFETs.

Channel doping is a known approach of tuning the threshold voltage. However, if the threshold voltage of the device is raised by increasing a doping concentration in a channel region, mobility of carriers drops, which results in degradation of the device performance. Moreover, ions with a high doping concentration in the channel region may neutralize ions in regions adjacent to source/drain regions and the channel region, which decreases a doping concentration in the adjacent region and increases resistance of the device.

The short channel effects can be suppressed by providing a ground plane (i.e. a grounded back gate) beneath a buried insulating layer. However, an integrated circuit may comprise many MOSFETs with different gate lengths. Although a high doping concentration in the back gate may be beneficial to the MOSFET with a short gate length for suppressing the short channel effects, it causes an excessively high threshold voltage for the MOSFET with a long gate length. Thus, it is desirable that the threshold voltage is adjusted differently for the MOSFETs with different gate lengths.

Moreover, in an SOI MOSFET, a back gate may be short-circuited to source/drain regions. In a conventional structure of the SOI MOSFET shown in FIG. 10, a back gate 18 is typically isolated from source/drain regions (not shown) in a semiconductor layer 13 by a buried insulating layer 12. However, the buried insulating layer 12 has only a thickness of about 5 nm-30 nm. A conductive path 22' may be unintentionally formed between the back gate 18 and the source/drain regions during a source/drain doping process or a silicidation process. Moreover, a conductive path 24' may be unintentionally formed between the back gate 18 and the source/drain regions in the process for providing conductive vias, due to misalignment when forming via holes by etching.

Thus, it is still desirable that the short circuit between the back gate and the source/drain regions can be avoided while the threshold voltage of the device is adjusted by the back gate.

SUMMARY OF THE DISCLOSURE

The object of the present disclosure is to provide a MOSFET having a threshold voltage adjustable by a back gate.

According to one aspect of the present disclosure, there is provided a MOSFET formed on an SOI wafer, the SOI wafer comprising a semiconductor substrate, a buried insulating layer on the semiconductor substrate, and a semiconductor layer on the buried insulating layer, the MOSFET comprising: a shallow trench isolation for defining an active region in the semiconductor layer; a gate stack on the semiconductor layer; a source region and a drain region in the semiconductor layer on both sides of the gate stack; a channel region in the semiconductor layer and sandwiched by the source region and the drain region; a back gate in the semiconductor substrate; a first dummy gate stack overlapping with a boundary between the semiconductor layer and the shallow trench isolation; and a second dummy gate stack on the shallow trench isolation, wherein the MOSFET further comprises a plurality of conductive vias which are disposed between the gate stack and the first dummy gate stack and electrically connected to the source region and the drain region respectively, and between the first dummy gate stack and the second dummy gate stack and electrically connected to the back gate.

According to another aspect of the present disclosure, there is provided a method for manufacturing a MOSFET in an SOI wafer, the SOI wafer comprising a semiconductor substrate, a buried insulating layer on the semiconductor substrate, and a semiconductor layer on the buried insulating layer, the method comprising: forming a shallow trench isolation for defining an active region in the semiconductor layer; performing a first ion implantation to form a back gate in the semiconductor substrate; forming a gate stack on the semiconductor layer; forming a first dummy gate stack overlapping with a boundary between the semiconductor layer and the shallow trench isolation; forming a second dummy gate stack on the shallow trench isolation; performing a second ion implantation to form a source region and a drain region in a self-aligned manner in the semiconductor layer with the gate stack and the first dummy gate stack as a hard mask; and forming a plurality of conductive vias which are disposed between the gate stack and the first dummy gate stack and electrically connected to the source region and the drain region respectively, and between the first dummy gate stack and the second dummy gate stack and electrically connected to the back gate.

The MOSFET according to the present disclosure comprises the back gate formed in the semiconductor substrate. When applying a bias voltage to the back gate, the resultant bias electric field is applied to the channel region through the buried insulating layer. The MOSFET can adjust a threshold voltage by changing the doping type and the doping concentration of the back gate.

Moreover, the MOSFET according to the present disclosure comprises the first dummy gate stack overlapping with the boundary between the semiconductor layer and the shadow trench isolation, and the second dummy gate stack on the shallow trench isolation. During a source/drain doping process or a silicidation process, the gate stack of the MOS- FET, the first dummy gate stack and the second dummy gate stack can be used as hard masks. The suicides are formed in a self-aligned manner, which, on one hand, avoids electrical connections between the conductive vias of the source and drain regions and the back gate, and on the other hand, avoids electrical connections between the conductive via of the back gate and the source and drain regions. Consequently, the MOSFET provides no conductive paths between the back gate and the source and drain regions, and avoids the short circuit between the back gate and the source and drain regions.

Preferably, in the present disclosure, the dummy gate stacks may be formed simultaneously with the gate stack of the MOSFET, without introducing additional deposition and patterning processes. The manufacture cost of the semiconductor device is not increased significantly.

Also preferably, a plurality of MOSFETs on a semiconductor substrate may be provided with a common back gate and a common contact for the back gate to have a footprint smaller than that of the MOSFETs provided with respective back gates and respective contacts for the back gates.

DETAILED DESCRIPTION

Exemplary embodiments of the present disclosure will be described in more details below with reference to the accompanying drawings. For the sake of clarity, various components in the attached drawings are not drawn to scale.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure. Unless the context clearly indicates otherwise, each part of the semiconductor device can be made of material(s) well known to one skilled person in the art.

In the present application, the term "semiconductor structure" means generally the whole semiconductor structure formed at each step of the method for manufacturing the semiconductor device, including all of the layers and regions having been formed.

In one embodiment according to the present disclosure, the steps shown in FIGS. 1 to 9 are performed for manufacturing a MOSFET.

Figure 1:
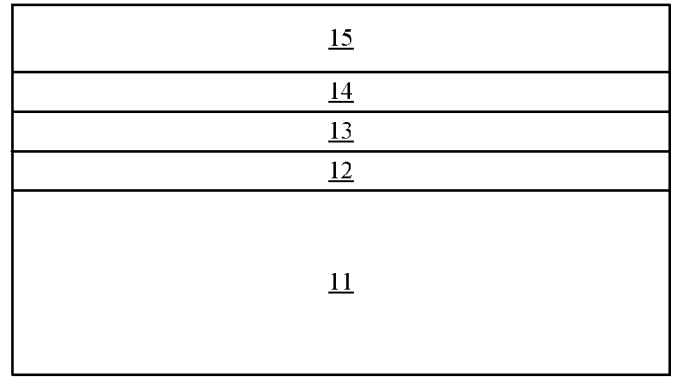
FIGS. 1-9 schematically show cross-sectional views in various stages of a method for manufacturing a MOSFET according to the present disclosure, respectively.

As shown in FIG. 1, an SOI wafer is used as an initial structure of the semiconductor substrate, comprising a semiconductor substrate 11, a buried insulating layer 12 and a semiconductor layer 13, from bottom to top. The semiconductor layer 13 may have a thickness of about 5 nm to about 20 nm, such as 10 nm or 15 nm. Moreover, the buried insulating layer 12 may have a thickness of about 5 nm to about 30 nm, such as 10 nm, 15 nm, 20 nm or 25 nm.

A portion of the semiconductor substrate 11 will be used for providing a back gate for the MOSFET. The semiconductor substrate 11 may be made of bulk silicon, Group IV semiconductor materials (such as SiGe or Ge), or Group III-V semiconductor materials (such as GaAs).

The buried insulating layer 12 may be one of a buried oxide layer, a buried oxynitride layer, and any other buried insulating layer.

The semiconductor layer 13 will be used for providing a source region, a drain region and a channel region of the MOSFET. The semiconductor layer 13 may be made of a semiconductor material selected from the group consisting of group-IV semiconductor (such as Si, Ge or SiGe) and group III-V compound semiconductor (such as GaAs). In the present embodiment, the semiconductor layer 13 may be monocrystalline silicon or SiGe.

The process for providing an SOI wafer is well known in the art. For example, a SmartCut™ process (referred as "Smart Cut" or "Smart Strip") can be used for this purpose. The SmartCut™ process comprises the steps of bonding two wafers with each other, each of which has a surface oxide layer formed by thermal oxidation or deposition, and one of which is subjected to hydrogen implantation so as to form a hydrogen implantation region at a predetermined depth in the silicon body below the surface oxide layer; converting the hydrogen implantation region to a layer having micro-cavities for subsequent separation, under the conditions of an increased pressure and an increased temperature; and separating one of the two wafers from the other of the two wafers. The wafer including a surface oxide layer bonded with the semiconductor substrate is used as an SOI wafer. By controlling process parameters in the thermal oxidation or in the deposition, a thickness of the buried insulating layer in the SOI wafer can be changed. By controlling implantation energy during the hydrogen implantation, a thickness of the semiconductor layer in the SOI wafer can be varied.

An oxide protection layer 14 having a thickness of about 5 nm to about 20 nm is then formed on the SOI wafer, for example, by sputtering or thermal oxidation. A nitride protection layer 15 having a thickness of about 30 nm to about 100 nm is then formed on the oxide protection layer 14, for example, by sputtering.

Figure 2:
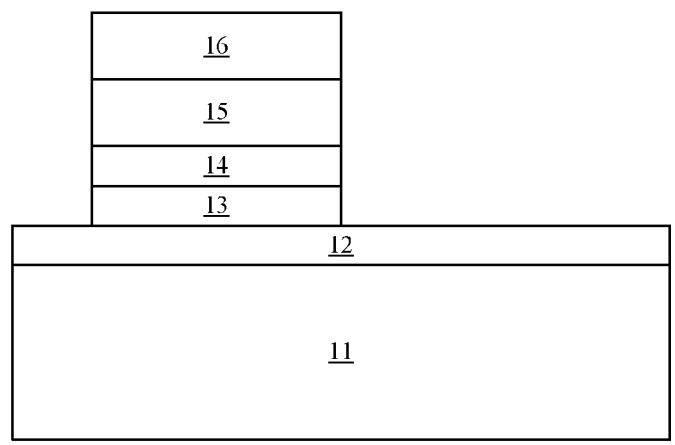

Next, the above semiconductor structure is patterned to form a trench, as shown in FIG. 2.

The patterning process may involve the following steps: a photoresist mask 16 having a pattern therein is formed on the nitride protection layer 15, by a conventional lithographical process including exposure and development steps; exposed portions of the nitride protection layer 15, the oxide protection layer 14 and the semiconductor layer 13 are removed from top to bottom by dry etching such as ion beam milling, plasma etching, reactive ion etching, laser ablation and the like, or wet etching using a solution of etchant, stopping on the top of the buried oxide layer 12; and the photoresist mask 16 is then removed by ashing or dissolution with a solvent.

Figure 3:
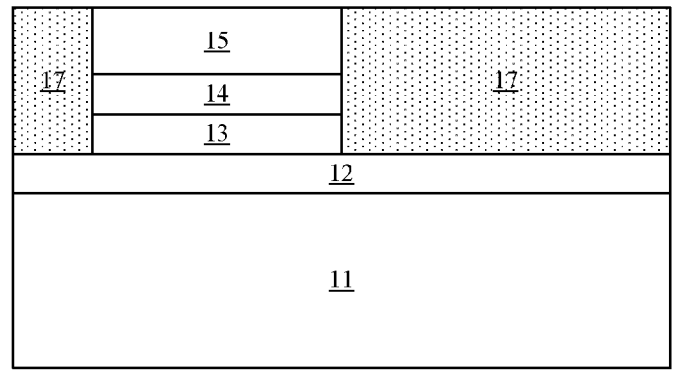

Next, an oxide is deposited on the whole surface of the above semiconductor structure, for example, by sputtering. The oxide fills up the trench. The surface of the semiconductor structure is planarized by chemical mechanical polishing (CMP). The CMP stops at the top of the nitride protection layer 15 and removes the oxide outside of the trench. The portion of oxide remaining in the trench forms a shallow trench isolation (STI) 17 for defining an active region of the MOSFET, as shown in FIG. 3.

Figure 4:
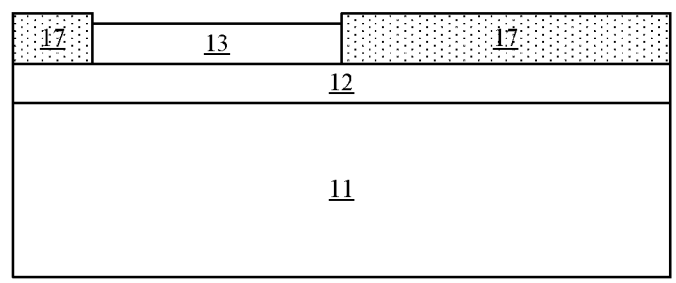

The oxide in the STI 17 is etched back to expose a portion of side surfaces of the nitride protection layer 15. The nitride protection layer 15 is then selectively removed with respect to oxides, for example, by wet etching using hot phosphoric acid. Further, the oxide protection layer 14 is removed by dry etching such as ion beam milling, plasma etching, reactive ion etching, laser ablation and the like, or wet etching using a solution of etchant, to expose the semiconductor layer 13, as shown in FIG. 4.

When the oxide protection layer 14 is removed, the oxide in the STI 17 is also etched. The oxide in the STI 17 is not over etched by accurately controlling an etching time, so that it has a top surface at least higher than the exposed top surface of the semiconductor layer 13 and still protects the underlying buried insulating layer 12.

Figure 5:
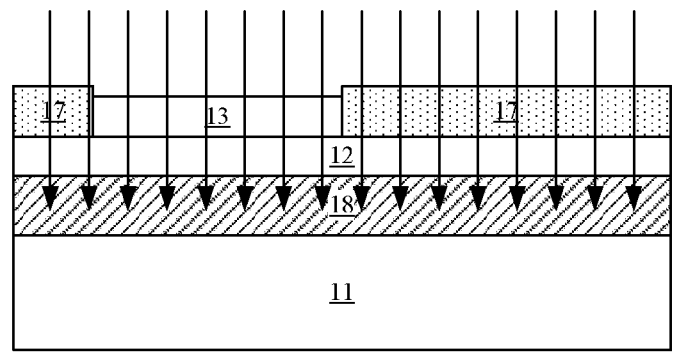

Next, a first ion implantation is performed in the semiconductor substrate 11, as shown in FIG. 5. Because a total thickness of the semiconductor layer 13 and the buried insulating layer 12 is only about 10-50 nm, the implanted ions easily penetrate these layers and reach the semiconductor substrate 11. A depth of implantation is controlled by changing implantation energy and dose, so that the implanted ions are distributed mainly in the semiconductor substrate 11.

The implantation region in the first on implantation provides a back gate 18. The back gate 18 may either abut the overlying buried insulating layer 12 (as shown in FIG. 5), or be separated from (i.e. not abut) the overlying buried insulating layer 12 with a distance (not shown).

A doping type of the back gate 18 may be either N-type or P-type. The doping type of the back gate 18 may be opposite to the type of the MOSFET to increase a threshold voltage of the MOSFET, i.e. P-type for an N-type MOSFET, or N-type for a P-type MOSFET. The doping type of the back gate 18 may be inverted to decrease the threshold voltage of the MOSFET.

As a P-type dopant, boron (B or BF2), Indium (In) or a combination thereof may be used. As an N-type dopant, arsenic (As), phosphor (P) or a combination thereof may be used.

A dose of the dopant in the first ion implantation can be determined according to technological level and product requirements, and may be, for example, about $1\times10^{13}$ cm$^{-2}$ to about $1\times10^{15}$ cm$^{-2}$. Consequently, the back gate 18 has a doping concentration of about $1\times10^{17}$ cm$^{-3}$ to about $1\times10^{20}$ cm$^{-3}$.

Preferably, a rapid anneal may be performed after the first ion implantation, which is also known as spike anneal, for example, by using laser, electron beam or infrared radiation, so as to remedy damages in the lattice and activate the implanted dopants.

Figure 6:
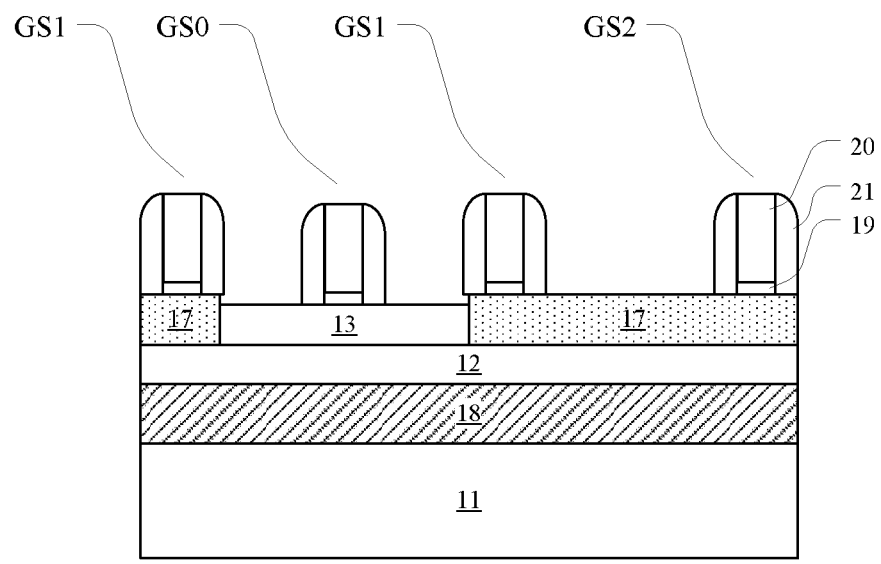
Figure 7:
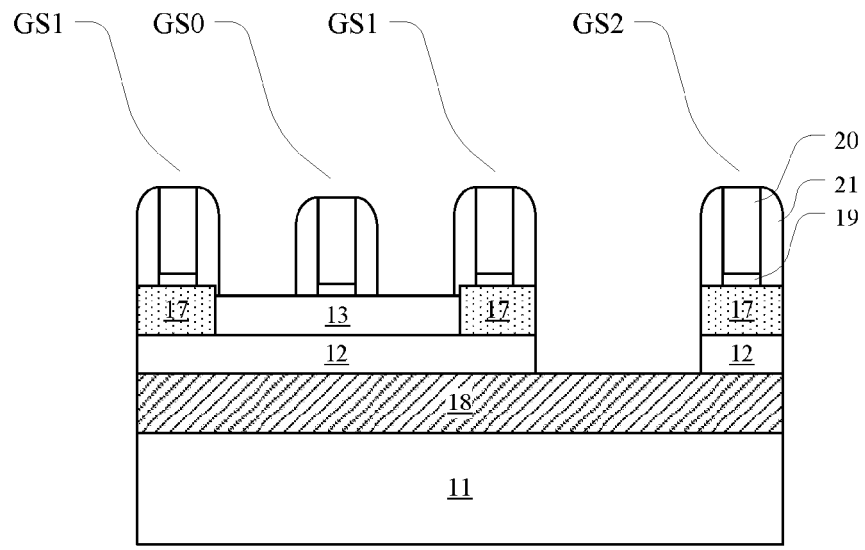

Next, a gate stack CS0 of the MOSFET, a first dummy gate stack GS1 and a second dummy gate stack GS2 are formed on the semiconductor structure, together with respective sidewall spacers 21, as shown in FIG. 6. The first dummy gate stack GS1 overlaps with a boundary between the semiconductor layer and the STI to prevent formation of a conductive path of short circuit in subsequent processes. The second dummy gate stack GS2 is disposed on the STI. Preferably, the gate stack GS0, the first dummy gate stack GS1 and the second dummy gate stack GS2 may have the same structure and be formed simultaneously in one step. Each of the gate stack GS0, the first dummy gate stack GS1 and the second dummy gate stack GS2 comprises a gate dielectric layer 19 having a thickness of about 1 nm to about 4 nm and a gate conductor 20 having a thickness of about 30 nm to about 100 nm. Deposition and patterning process for forming the gate stack and sidewall spacers are known. The gate conductor 20 is typically patterned to a strip.

The gate dielectric layer 19 may be made of one of oxides, oxynitrides and high-K materials (such as, one of $HfO_2$, $HfSiO$, $HiSiON$, $HfTaO$, $HfTiO$, $HfZrO$, $Al_2O_3$, $La_2O_3$, $ZrO_2$ and $LaAlO$, or any combination thereof), or any combination thereof. The gate conductor 20 can be for example a metal layer, a doped polysilicon layer, or a multilayer gate conductor including a metal layer and a doped polysilicon layer.

Alternatively, the first dummy gate stack GS1 and the second dummy gate stack GS2 may have a structure and/or a composition different from that of the gate stack GS0 of the MOSFET. For example, the first dummy gate stack GS1 and the second dummy gate stack GS2 may not include gate dielectric layer 19. In such a case, the gate stack GS0 of the MOSFET, and the first dummy gate stack GS1 and the second dummy gate stack GS2 may be formed in different steps and/or by using different masks.

The channel region comprises the portion (not shown) of the semiconductor layer 13 below the gate stack GS0 of the MOSFET, and is preferably undoped or self-doped or doped in a previous independent ion implantation process.

Next, a second on implantation is performed to form a source region and a drain region in the semiconductor layer 13 in a self-aligned manner on both sides of the gate stack GS0 of the MOSFET, with the gate stack GS0 of the MOSFET and the first dummy gate stack GS1 as a hard mask. A depth of implantation is controlled by changing implantation energy and dose, so that the implanted ions are distributed mainly in the semiconductor layer 13.

Preferably, a rapid anneal is performed after the second on implantation, which is also known as spike anneal, for example, by using laser, electron beam or infrared radiation, so as to remedy damages in the lattice and activate the implanted dopants.

Next, openings, which extend through the STI 17 and the buried insulating layer 12 and reach the back gate 18, are formed with the first dummy gate stack GS1 and the second dummy gate stack GS2 as a hard mask, for example, by wet etching which selectively removes oxides. The selective wet etching exposes the top surface of the back gate 18 but does not affect the source and drain regions.

Figure 8:
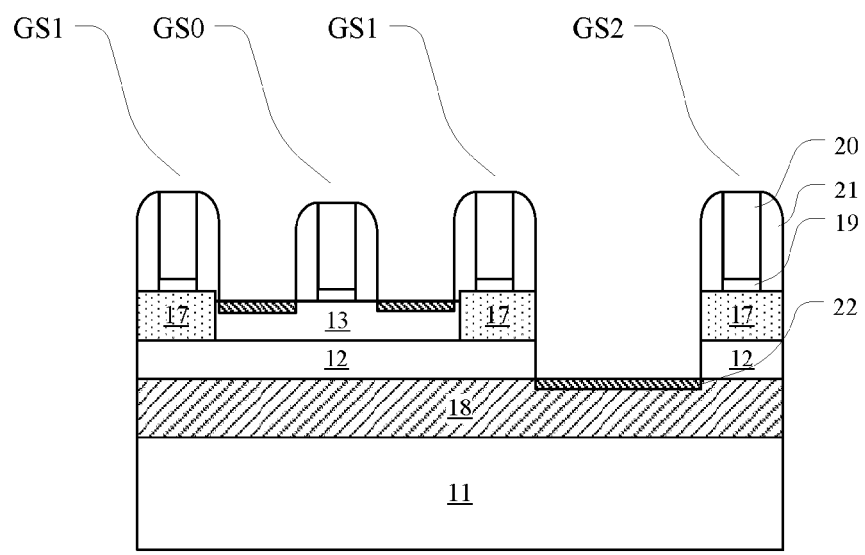

Next, a silicidation process is performed to form silicides 22 at the exposed top surfaces of the back gate 18 and the source/drain regions, as shown in FIG. 8. Note that the silicidation process is performed in a self-aligned manner with the gate stack GS0 of the MOSFET, the first dummy gate stack GS1 and the second dummy gate stack GS2 as a hard mask.

The silicidation process is well known, for example, comprising the steps of conformally forming an Ni layer and a Pt layer in sequence by the above-mentioned deposition process; performing an annealing treatment at a temperature of about 300-500° C. so that the deposited Ni and Si react with each other to form NiPtSi; and finally, selectively removing the un-reacted Ni and Pt with respect to the silicide by wet etching.

Figure 9:
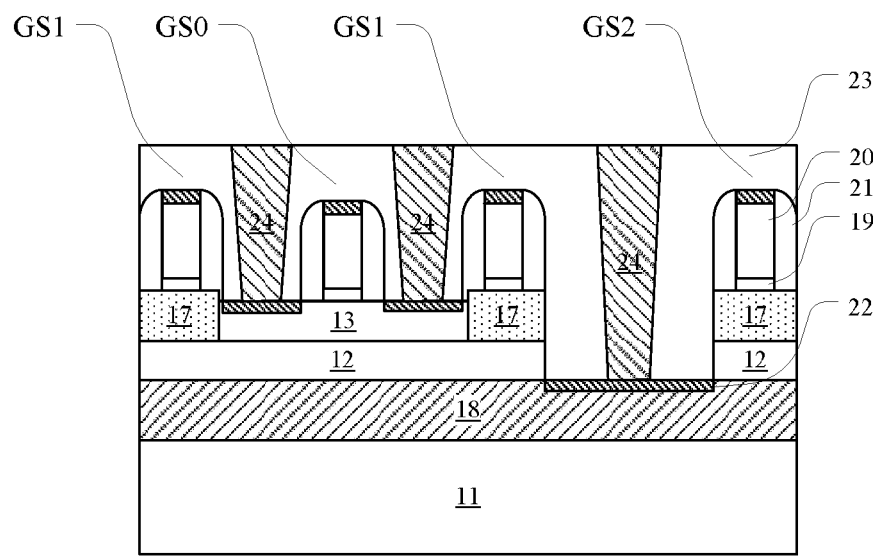
Figure 10:
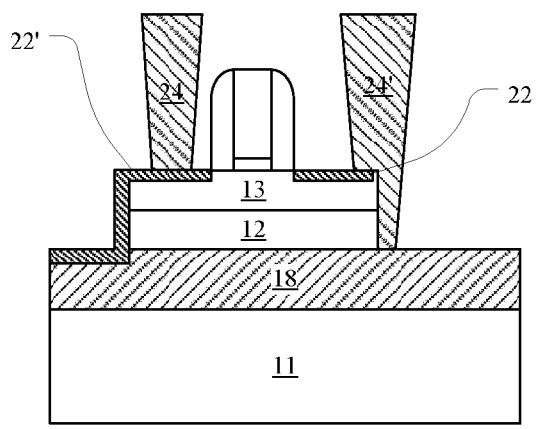
FIG. 10 schematically shows a cross-sectional view of a conventional MOSFET, which indicates short circuits between a back gate and source/drain regions.

Next, an insulating material is deposited, for example, by sputtering, and planarized by CMP to have a planar surface. An interlayer dielectric layer 23 is then formed on the whole surface of the semiconductor structure. Reactive ion etching is then performed through a photoresist mask to form via holes which extend through the interlay dielectric layers 23 and reach the source/drain regions (not shown) and the back gate 18 respectively. The via holes are then filled with a conductive material. The portion of the conductive material outside of the via holes is removed by CMP so that the remaining portions of the conductive material in the via holes form conductive vias 24 which are electrically connected to the source/drain regions and the back gate, as shown in FIG. 9. The conductive vias 24 contact the silicides 22 at the top surfaces of the back gate 18 and the source/drain regions (not shown) to reduce electrical resistance. The conductive material for the conductive vias 24 may be but not limited to Cu, Al, W, polysilicon and other similar conductive materials.

FIG. 9 shows a MOSFET manufactured with a method according to the present disclosure. The MOSFET is formed on an SOI wafer which comprises a semiconductor substrate 11, a buried insulating layer 12 on the semiconductor substrate 11, and a semiconductor layer 13 on the buried insulating layer 12. The MOSFET comprises a shallow trench isolation 17 for defining an active region in the semiconductor layer 13; a gate stack GS0 on the semiconductor layer 13; a source region and a drain region (nor shown) in the semiconductor layer 13 on both sides of the gate stack GS0; a channel region (nor shown) in the semiconductor layer 13 and sandwiched by the source region and the drain region; a back gate 18 in the semiconductor substrate 11 and extending at least below the channel region; a first dummy gate stack GS1 overlapping with a boundary between the semiconductor layer 13 and the shallow trench isolation 17; and a second dummy gate stack GS2 on the shallow trench isolation 17. The MOSFET further comprises a plurality of conductive vias 24 which are disposed between the gate stack GS0 and the first dummy gate stack GS1 and electrically connected to the source region and the drain region (not shown) respectively, and between the first dummy gate stack GS1 and the second dummy gate stack GS2 and electrically connected to the back gate 18.

While the disclosure has been described with reference to specific embodiments, the description is illustrative of the disclosure. The description is not to be considered as limiting the disclosure. One skilled person will readily recognize that various modifications and changes may be made to the present invention without departing from the true scope of the present invention.

We claim:

1. A MOSFET formed on an SOI wafer, the SOI wafer comprising a semiconductor substrate, a buried insulating layer on the semiconductor substrate, and a semiconductor layer on the buried insulating layer, the MOSFET comprising:
   a shallow trench isolation for defining an active region in the semiconductor layer;
   a gate stack on the semiconductor layer;
   a source region and a drain region in the active region on both sides of the gate stack;
   a channel region in the active region and sandwiched by the source region and the drain region;
   a back gate in the semiconductor substrate;
   a first dummy gate stack overlapping with a boundary between a portion of the active region on a side where one of the source and drain regions is disposed with respect to the gate stack and the shallow trench isolation; and
   a second dummy gate stack on the shallow trench isolation, the second dummy gate stack being disposed on the same side as the first dummy gate stack with respect to the gate stack,
   wherein the MOSFET further comprises a first conductive via disposed between the gate stack and the first dummy gate stack and electrically connected to the one of the source region and the drain region, and a second conductive via disposed between the first dummy gate stack and the second dummy gate stack and electrically connected to the back gate.

2. The MOSFET according to claim 1, wherein the back gate has a doping type the same as or opposite to a conductivity type of the MOSFET.

3. The MOSFET according to claim 1, wherein the back gate has a doping concentration of about $1\times10^{17}$ cm$^{-3}$ to about $1\times10^{20}$ cm$^{-3}$.

4. The MOSFET according to claim 1, wherein the gate stack, the first dummy gate stack and the second dummy gate stack have the same structure.

5. The MOSFET according to claim 4, wherein each of the gate stack, the first dummy gate stack and the second dummy gate stack comprises a gate dielectric layer and a gate conductor.

6. The MOSFET according to claim 1, further comprising silicides formed at surfaces of the back gate, the source region and the drain region, wherein the first and the second conductive vias are in contact with the silicides.

7. The MOSFET according to claim 1, further comprising:
   a third dummy gate stack overlapping with a boundary between a portion of the active region on a side where the other of the source and drain regions is disposed with respect to the gate stack and the shallow trench isolation; and
   a third conductive via disposed between the gate stack and the third dummy gate stack and electrically connected to the other of the source region and the drain region.

8. The MOSFET according to claim 1, wherein a gap between the first dummy gate stack and the gate stack is above the one of the source region and the drain region, and a gap between the first dummy gate stack the second dummy gate stack is above the shallow trench isolation.

9. The MOSFET according to claim 7, wherein a gap between the third dummy gate stack and the gate stack is above the other of the source region and the drain region.

10. A method for manufacturing a MOSFET in an SOT wafer, the SOT wafer comprising a semiconductor substrate, a buried insulating layer on the semiconductor substrate, and a semiconductor layer on the buried insulating layer, the method comprising:
    forming a shallow trench isolation for defining an active region in the semiconductor layer;
    performing a first ion implantation to form a back gate in the semiconductor substrate;
    forming a gate stack on the semiconductor layer;
    forming a first dummy gate stack overlapping with a boundary between the active region and the shallow trench isolation;
    forming a second dummy gate stack on the shallow trench isolation on the same side as the first dummy gate stack with respect to the gate stack;
    performing a second ion implantation to form a source region and a drain region in a self-aligned manner in the semiconductor layer with the gate stack and the first dummy gate stack as a hard mask; and
    forming a first conductive via disposed between the gate stack and the first dummy gate stack and electrically connected to one of the source region and the drain region adjacent to the boundary where the first dummy gate stack is disposed, and a second conductive via disposed between the first dummy gate stack and the second dummy gate stack and electrically connected to the back gate.

11. The method according to claim 10, wherein an implantation dose for the first ion implantation is about $1\times10^{13}$ cm$^{-2}$ to about $1\times10^{15}$ cm$^{-2}$.

12. The method according to claim 10, wherein dopants used in the first ion implantation have a doping type the same as or opposite to a conductivity type of the MOSFET.

13. The method according to claim 10, wherein the step of forming the gate stack, the step of forming the first dummy gate stack and the step of forming the second dummy gate stack are implemented as one step.

14. The method according to claim 10, further comprising forming silicides at surfaces of the back gate, the source region and the drain region with the gate stack, the first dummy gate stack and the second dummy gate stack as a hard mask, between the step of performing the second ion implantation and the step of forming the plurality of conductive vias.

15. The method according to claim 10, further comprising:
   forming a third dummy gate stack overlapping with a boundary between the active region and the shallow trench isolation; and
   forming a third conductive via disposed between the gate stack and the third dummy gate stack and electrically connected to the other of the source region and the drain region adjacent to the boundary where the third dummy gate stack is disposed.

16. The method according to claim 10, wherein a gap between the first dummy gate stack and the gate stack is above the one of the source region and the drain region, and a gap between the first dummy gate stack the second dummy gate stack is above the shallow trench isolation.

17. The method according to claim 15, wherein a gap between the third dummy gate stack and the gate stack is above the other of the source region and the drain region.

* * * * *